United States Patent [19]

Fukuhara et al.

[11] Patent Number: 5,111,141
[45] Date of Patent: May 5, 1992

[54] MAGNETIC FIELD MEASUREMENT OPTIMIZATION APPARATUS USING A CHARGED PARTICLE BEAM

[75] Inventors: Satoru Fukuhara, Katsuta; Hiroyuki Shinada, Chyofu; Shigemitsu Seitoh, Kokubunji, all of Japan

[73] Assignee: Hitachi, Ltd., Tokyo, Japan

[21] Appl. No.: 607,351

[22] Filed: Oct. 31, 1990

[30] Foreign Application Priority Data

Nov. 1, 1989 [JP] Japan .................. 1-282956

[51] Int. Cl.⁵ .......................................... G01R 33/02
[52] U.S. Cl. .......................................... 324/250
[58] Field of Search ............... 324/250, 244.1, 226, 324/260-262, 244, 637, 642, 644; 33/360; 250/298-300, 294; 313/421, 433, 430, 431, 432, 156

[56] References Cited

U.S. PATENT DOCUMENTS

3,727,127  4/1973  Heidenwolf ................. 324/250
4,803,430  2/1989  Shinada et al. .............. 324/250

OTHER PUBLICATIONS

"49th Oyo Butsuri Gakkai Gakujutsu Keen Yoko-shu", p. 559, Oct. 1988.

"IEEE Transactions on Magnetics", vol. MAG-21, No. 5, pp. 1593-1595, Sep. 1985.

*Primary Examiner*—Kenneth A. Wieder
*Assistant Examiner*—Warren S. Edmonds
*Attorney, Agent, or Firm*—Fay, Sharpe, Beall, Fagan, Minnich & McKee

[57] ABSTRACT

A magnetic field measuring apparatus measures the magnetic field intensity of a magnetic field created by a sample magnetic head by passing a finely focussed charged particle beam through the magnetic field and by measuring the deflection of the charged particle beam caused by the deflecting action of the magnetic field on the charged particle beam. The path of the charged particle beam (the sample magnetic head) is shifted stepwise toward the sample magnetic head (the path of the charged particle beam) until the charged particle impinges on the surface of the sample magnetic head. Upon the detection of the impingement of the charged particle beam on the surface of the sample magnetic head, the path of the charged particle beam (the sample magnetic head) is put one step back so that the path of the charged particle beam extends as close as possible to the surface of the sample magnetic head for accurate magnetic field intensity measurements. Thus, the distribution of magnetic field intensity in the magnetic field can be accurately determined.

21 Claims, 1 Drawing Sheet

MAGNETIC FIELD MEASUREMENT OPTIMIZATION APPARATUS USING A CHARGED PARTICLE BEAM

BACKGROUND OF THE INVENTION

1. Field of the Invention

The present invention relates to a magnetic field measurement optimization apparatus using a charged particle beam and, more particularly, to a magnetic field measuring apparatus capable of measuring the distribution of magnetic field intensity in the vicinity of a sample.

2. Description of the Related Art

The recording density of magnetic recording apparatus, such as magnetic disk memories, magnetic tape recorders and VTRs, has been increased remarkably in recent years, and the further improvement in performance of magnetic heads to be incorporated into such magnetic recording apparatus has been required. The magnetic head must be capable of recording information in a narrow track having a sharp recording field intensity distribution to achieve high-density magnetic recording.

The reduction of the dimension of the magnetic head along the width of the track to establish a sharp recording field intensity distribution brought about a significant problem that leakage flux across tracks causes erroneous writing in the adjacent tracks. Thus, the development of a magnetic head that produces less leakage flux across tracks has been required. A magnetic field measuring apparatus capable of minutely measuring the distribution of magnetic field intensity in a recording magnetic field created by a magnetic head is essential to research for the development of a magnetic head suitable for high-density recording.

A known magnetic field measuring method for measuring the distribution of magnetic field intensity in a recording magnetic field created by a magnetic head passes an electron beam through the magnetic field created around the magnetic gap of the magnetic head to measure the magnetic field intensity at a position through which the electron beam is passed through the measurement of the deflection of the electron beam by the Lorentz force of the magnetic field. The magnetic field is scanned by the electron beam to determine the distribution of magnetic field intensity in the magnetic field.

Another known magnetic field measuring method measures the three-dimensional distribution of magnetic field intensity in a magnetic field. This method rotates gradually a sample that creates a magnetic field, scans the magnetic field with an electron beam with the sample at different angular positions, measures the deflection of the electron beam by an electron beam detector, and determines the magnetic field intensity at each position in the magnetic field through calculation using the variation in the detected position of the electron beam, i.e., the variation in the deflection of the electron beam. Detection signals provided by the electron beam detector are stored in a computer, and the detection signals are processed by a computerized tomography method (hereinafter referred to as "CT method") to reconstruct the three-dimensional distribution of magnetic field intensity in the magnetic field.

Results of such measurements of the three-dimensional distribution of magnetic field intensity are stated in "49th Oyo Butsuri Gakkai Gakujutsu Keen Yokoshu", p. 559, Oct., 1988 and "IEEE Transactions on Magnetics", vol. MAG-21, No. 5, pp. 1593-1595, Sept., 1985.

For the two-dimensional measurement of the leakage flux of a magnetic head having a very narrow magnetic head gap, the magnetic field intensity must be measured at positions as near as possible to the magnetic head gap. To meet such a requirement, the scanning electron beam must be controlled so as to fall at positions as near as possible to the surface of the magnetic head gap. To control the electron beam in such a manner, the position of the incident scanning electron beam must be controlled and the position of sample stage for holding the sample magnetic head must be adjusted in high accuracy. Also in the measurement of the three-dimensional distribution of magnetic field intensity by the CT method, the electron beam must be controlled while the sample magnetic head is turned through an angle of 180° so as to fall at a position as near as possible to the surface of the magnetic head at each angular position of the magnetic head. Accordingly, the angular position of the sample magnetic head must be controlled in high accuracy and the sample stage must be controlled in high accuracy for the optimum positioning of the sample magnetic head with respect to the three dimensional directions, i.e., the X, Y and Z directions, because the final accuracy of measurement of the three-dimensional distribution of magnetic field intensity is dependent on the accuracy of sample stage control. Since the electron beam is passed through a position at a very short distance on the order of several micrometers from the surface of the sample magnetic head, the electron beam may fall on the surface of the sample magnetic head to make the measurement of the distribution of magnetic field intensity impossible if the positional relation between the electron beam and the surface of the sample magnetic head, namely, the position of the electron beam on the Z axis relative to the surface of the sample magnetic head, changes even a little bit.

SUMMARY OF THE INVENTION

The present invention has been made to solve the foregoing problems in the prior art and it is therefore an object of the present invention to provide a magnetic field measuring apparatus capable of maintaining a charged particle beam as close as possible to the surface of a sample in measuring the distribution of magnetic field intensity in a magnetic field created by the sample by the charged particle beam and of preventing the impingement of the charged particle beam on the surface of the sample during the measurement of the distribution of magnetic field intensity.

To achieve the object, the present invention provides a magnetic field measuring the apparatus which detects continuously the positional relation between a charged particle beam traveling in a magnetic field created by a sample and the surface of the sample, and corrects the three-dimensional position of the charged particle beam or the three-dimensional position of the surface of the sample on the basis of data representing the positional relation between the charged particle beam and the surface of the sample.

Thus, the present invention enables magnetic field measurement with the charged particle beam being passed as near as possible to the surface of the sample, preventing the impingement of the charged particle beam on the surface of the sample.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENT

Prior to the description of a magnetic field measuring apparatus embodying the present invention, the principle on which the magnetic field measuring apparatus operates will be described with reference to FIG. 2. The magnetic field measuring apparatus employs an electron beam for measurement.

Figure 2:
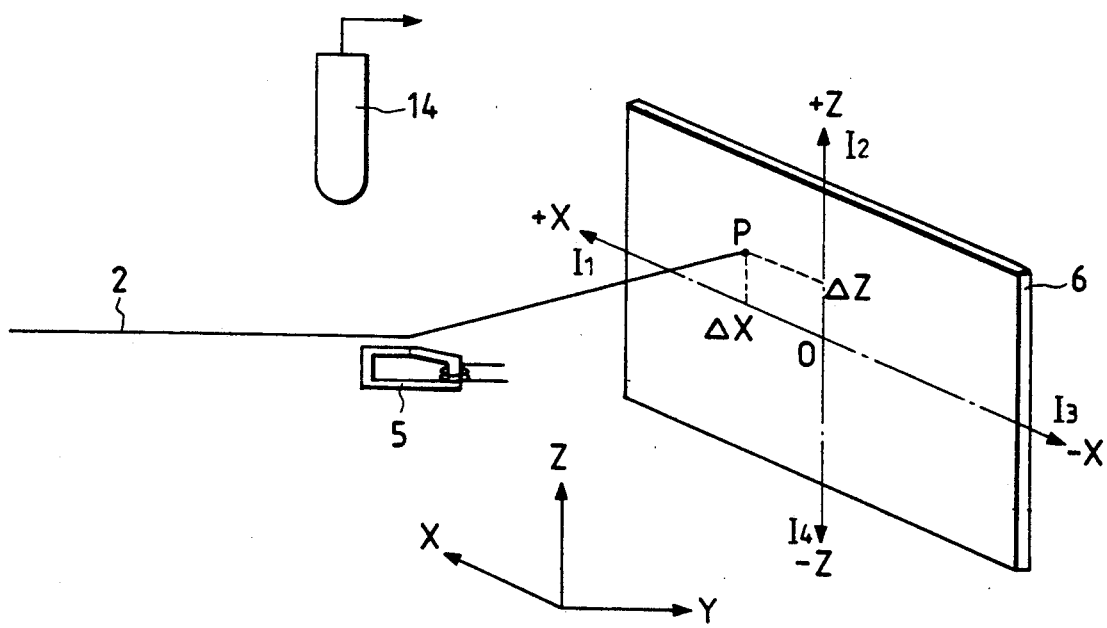
FIG. 2 is a diagrammatic view of assistance in explaining the principle on which the magnetic field measuring apparatus of FIG. 1 operates for magnetic field measurement.

Referring to FIG. 2, a narrow primary electron beam 2 is passed in parallel to the horizontal sliding surface of a magnetic head 5. Then, the primary electron beam is deflected in proportion to the leakage flux from the magnetic head 5 and falls on a semiconductor position detecting device 6. The magnetic field measuring apparatus is adjusted previously so that the primary electron beam 2 falls on the center, namely, the origin O on the X-Z plane of the three-dimensional orthogonal coordinate system, of the semiconductor position detecting device 6, when the magnitude of leakage flux from the magnetic head 5 is zero. The deflected electron beam 2 falls on the semiconductor position detecting device 6 at a point P of incidence. The coordinates ($\Delta X$, $\Delta Z$) of the point P representing the deflection of the electron beam 2 are proportional to the X-axis component and Z-axis component, respectively, of the leakage flux at a position near the sliding surface of the magnetic head 5 through which the electron beam 2 has been passed. Thus, the leakage flux from the magnetic head 5 can be determined through the measurement of the coordinates ($\Delta X$, $\Delta Z$) of the point P.

The relation between the output currents of the semiconductor position detecting device 6 and the coordinates (#X, #Z) of the pont P is expressed by:

$$\Delta Z = C(I_1 - I_3)/(I_1 + I_3)$$

$$\Delta X = C(I_2 - I_4)/(I_2 + I_4)$$

where $I_1$ is an output current at a $+Z$ terminal, $I_2$ is an output current at a $+X$ terminal, $I_3$ is an output current at a $-Z$ terminal, $I_4$ is an output current at a $-X$ terminal, and C is a constant.

Thus, the coordinates ($\Delta X$, $\Delta Z$) of the point P are determined from the measured output currents $I_1$, $I_2$, $I_3$ and $I_4$ of the semiconductor position detecting device 6, and the leakage flux from the magnetic head 5 can be determined from the coordinates ($\Delta X$, $\Delta Z$) of the point P. The total output current $I_t$ of the semiconductor position detecting device 6 is proportional to the current $I_0$ supplied by the incident primary electron beam 2 and is expressed by:

$$I_t = I_1 + I_2 + I_3 + I_4 - K \cdot I_0$$

where K is a proportional constant. Ordinarily, the value of K is about fifty.

In measuring the distribution of magnetic field intensity in the vicinity of the magnetic head 5 on such a principle, it is desirable to pass the primary electron beam 2 as near as possible to the surface of the magnetic head 5 to measure the distribution of magnetic field intensity in a region as near as possible to the surface of the magnetic head 5. It is absolutely necessary to avoid the primary electron beam 2 impinging on the surface of the magnetic head 5 during the measurement.

The present invention prevents the impingement of the primary electron beam 2 on the surface of the magnetic head 5, i.e., the sample, by highly accurately adjusting the position of a sample stage holding the magnetic head 5 on the Z axis or the position of the primary electron beam on the Z axis.

As is obvious from FIG. 2, when the primary electron beam 2 and the magnetic head 5 are brought closer to each other, eventually, the primary electron beam 2 impinges on the magnetic head 5 and does not fall on the semiconductor position detecting device 6, so that the total output current $I_t$ of the semiconductor position detecting device 6 drops to zero. Accordingly, the total output current $I_t$ of the semiconductor position detecting device 6 is monitored while the primary electron beam 2 and the magnetic head 5 are being brought closer to each other, the approach of the primary electron beam 2 and the magnetic head 5 to each other is stopped upon the drop of the total current $I_t$ to zero, and then the primary electron beam 2 and the magnetic head 5 are separated slightly from each other, so that the primary electron beam can be passed as near as possible to the surface of the magnetic head 5.

Figure 1:
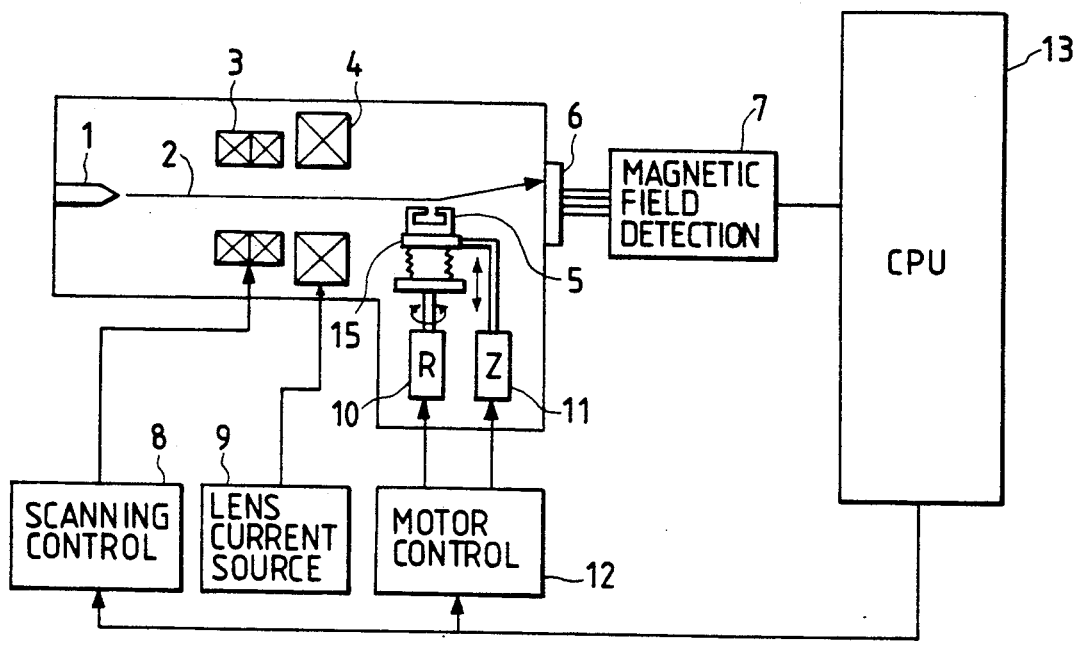
FIG. 1 is a block diagram of a magnetic field measuring apparatus in a preferred embodiment according to the present invention.

Referring to FIG. 1, a primary electron beam 2 emitted by an electron gun 1 is converged in a narrow beam by an objective lens 4 so as to travel in a plane extending several micrometers above the front surface of a sample magnetic head 5 provided with a magnetic gap. An exciting current is supplied to the exciting coil of the magnetic head 5 to create a magnetic field around the magnetic gap of the magnetic head 5. The primary electron beam 2 passing through the magnetic field is deflected by the Lorentz force produced by the leakage flux from the magnetic head 5, and the deflected primary electron beam 2 falls on a semiconductor position detecting device 6 at a point P of incidence. The semiconductor position detecting device 6 provides position data representing the coordinates ($\Delta X$, $\Delta Y$) of the point P corresponding to the deflection of the primary electron beam 2, a magnetic field detecting circuit 7 converts the position data into corresponding magnetic field intensity data and gives the same to a central processing unit (CPU) 13.

The distribution of magnetic field intensity is determined by moving the primary electron beam 2 by a scanning coil 3 in the X-Y plane to scan the magnetic field at different positions in the X-Y plane. A sample stage 15 mounting the magnetic head 5 is turned stepwise through increments of a minute angle at a time by a motor 10, and the foregoing scanning operation is performed for each angular position of the magnetic head 5 to measure the distribution of magnetic field intensity along different directions.

Methods of passing the primary electron beam 2 as nearly as possible to the front surface of the magnetic head 5 will be described hereinafter.

A first method moves the magnetic head 5 relative to the primary electron beam 2 to locate the front surface of the magnetic head 5 at a closest possible to the primary electron beam 2. Upon the reception of a position adjusting command from the PU 13, a motor control circuit 12 actuates a Z-axis motor 11 to move the magnetic head in parallel to the Z axis toward the primary electron beam 2. The Z-axis motor 11 is a stepping motor that moves the magnetic head 5 stepwise toward the primary electron beam 2 by steps corresponding to the number of driving pulses provided by the motor control circuit 12. While the magnetic head 5 is being moved toward the primary electron beam 2, the output current of the semiconductor position detecting device 6 is monitored. Upon the interception of the primary electron beam 2 by the magnetic head 5, namely, upon the drop of the output current of the semiconductor position detecting device 6 to zero, the Z-axis motor 12 is stopped. Then the Z-axis motor 12 is driven by one step of rotation in the reverse direction to move the magnetic head 5 away from the primary electron beam 2 by a distance corresponding to one step, whereby the magnetic head 5 is positioned at a position closest to the primary electron beam 2. In this state, the output currents of the semiconductor position detecting device 6 are processed to obtain data representing the magnetic field intensity at a position closest to the front surface of the magnetic head 5. The previously described scanning operation is performed to determine the distribution of magnetic field intensity in different directions.

A second method moves the path of the primary electron beam 2 relative to the magnetic head 5. Upon the reception of a position adjusting command from the CPU 13, a scanning control circuit 8 changes a Z-axis deflection current supplied to the scanning coil 3 to change the path of the primary electron beam 2 along the Z axis so that the primary electron beam 2 approaches the front surface of the magnetic head 5. The scanning control circuit 8 moves the primary electron beam 2 for scanning operation by a digital scanning system. The position of the path of the primary electron beam 2 on the Z axis is changed stepwise by changing the Z-axis deflection current supplied to the scanning coil stepwise. Upon the drop of the output currents of the semiconductor position detecting device 6 to zero, the movement of the path of the primary electron beam 2 toward the magnetic head 5 is stopped, and then the path of the primary electron beam 2 is moved one step back. In this state, the primary electron beam 2 passes a position as near as possible to the front surface of the magnetic head 5.

Although this embodiment adjusts the position of the path of the primary electron beam 2 or the magnetic head 5 on the Z axis with reference to a state where the output currents of the semiconductor position detecting device 6 drops to zero, the position of the path of the primary electron beam 2 or the magnetic head 5 on the Z axis may be adjusted by using a secondary electron detection signal which can be obtained through the detection of secondary electrons emitted from the magnetic head 5 due to the impingement of the primary electron beam 2 on the surface of the magnetic head 5.

For example, a secondary electron detector 14 is disposed over the magnetic head 5 as shown in FIG. 2. Upon the impingement of the primary electron beam 2 on the magnetic head 5, the magnetic head 5 emits secondary electrons. Then, the secondary electron detector 14 detects the secondary electrons and gives a secondary electron detection signal to the CPU 13. The primary electron beam 2 or the magnetic head 5 is shifted stepwise while the secondary electron detection signal is monitored. Upon the detection of the secondary electrons, the stepwise shift of the primary electron beam 2 or the magnetic head 5 is stopped, and then the primary electron beam 2 or the magnetic head 5 is shifted one step back. In this state, the primary electron beam 2 and the magnetic head 5 are located closest to each other.

In determining the three-dimensional distribution of magnetic field intensity by the CT method by rotating the magnetic head 5, the foregoing measuring procedure is executed for each angular position of the magnetic head 5 with the primary electron beam 2 and the magnetic head 5 located with the least possible distance therebetween.

Naturally, the primary electron beam 2 may be substituted by an ion beam.

As is apparent from the foregoing description, according to the present invention, the position of the path of the electron beam as a probe, relative to the sample magnetic head can be simply and accurately adjusted for the highly accurate measurement of the magnetic field created around the sample magnetic head.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A magnetic field measurement optimization apparatus for optimizing the measurement of a magnetic field created by a sample, comprising:
    charged particle beam emitting means for emitting a finely focussed charged particle beam so as to travel through and be deflected by a magnetic field created by a sample;
    impingement detecting means for detecting the impingement of the charged particle beam on the surface of the sample; and
    position adjusting means for adjusting the propagation path of the charged particle beam relative to the sample on the basis of an impingement detection signal provided by the impingement detecting means to maximize the deflection of the charged particle beam by the magnetic field.

2. A magnetic field measurement optimization apparatus as claimed in claim 1, further comprising:
    deflection measuring means for measuring the deflection of the charged particle beam caused by the deflecting action of the magnetic field on the charged particle beam; and
    calculating means for calculating the magnetic field intensity, based on the measured deflection, at a position through which the charged particle beam propagates through the magnetic field;
    wherein said position adjusting means adjusts the propagation path of the charged particle beam so as to maximize the calculated magnetic field intensity.

3. A magnetic field measurement optimization apparatus according to claim 2, wherein said deflection measuring means comprises a position detector capable of detecting the position of incidence of the deflected charged particle beam on a plane perpendicular to a direction in which the charged particle beam travels before the same is deflected by the magnetic field created by the sample.

4. A magnetic field measurement optimization apparatus according to claim 3, wherein said position detector is a semiconductor position detecting device.

5. A magnetic field measurement optimization apparatus according to claim 1, wherein said charged particle beam is an electron beam.

6. A magnetic field measurement optimization apparatus according to claim 4, wherein said impingement detecting means detects the drop of an output current of the semiconductor position detecting device toward zero, and provides an impingement detection signal upon the detection of the drop of the output current of the semiconductor position detecting device toward zero.

7. A magnetic field measurement optimization apparatus according to claim 1, wherein said impingement detection means comprises a secondary electron detector for detecting secondary electrons emitted by the sample upon the impingement of the charged particle beam on the surface of the sample.

8. A magnetic field measurement optimization apparatus according to claim 1, wherein said position adjusting means moves the sample relative to the charged particle beam to adjust the position of the path of the charged particle beam relative to the sample.

9. A magnetic field measurement optimization apparatus according to claim 1, wherein said position adjusting means changes the path of the charged particle beam relative to the sample to adjust the position of the charged particle beam relative to the sample.

10. A magnetic field measurement optimization apparatus according to claim 1, wherein said position adjusting means brings the charged particle beam and the sampler closer stepwise to each other, stops bringing the charged particle beam and the sample closer to each other upon the detection of the impingement of the charged particle beam on the surface of the sample by the impingement detecting means, and then returns the positional relation between the charged particle beam and the sample back to a state one step before the state at which the charged particle beam impinged on the surface of the sample.

11. A magnetic field measurement optimization apparatus according to claim 2, wherein said position adjusting means brings the charged particle beam and the sample closer stepwise to each other, stops bringing the charged particle beam and the sample closer to each other upon the detection of the impingement of the charged particle beam on the surface of the sample by the impingement detecting means, and then returns the positional relation between the charged particle beam and the sample back to a state one step before the state at which the charged particle beam impinged on the surface of the sample.

12. A magnetic field measurement optimization apparatus according to claim 2, wherein said charged particle beam is an electron beam.

13. A magnetic field measurement optimization apparatus according to claim 2, wherein said impingement detection means comprises a secondary electron detector for detecting secondary electrons emitted by the sample upon the impingement of the charged particle beam on the surface of the sample.

14. A magnetic field measurement optimization apparatus according to claim 2, wherein said position adjusting means moves the sample relative to the charged particle beam to adjust the position of the path of the charged particle beam relative to the sample.

15. A magnetic field measurement optimization apparatus according to claim 2, wherein said position adjusting means changes the path of the charged particle beam relative to the sample to adjust the position of the charged particle beam relative to the sample.

16. A magnetic field measurement optimization apparatus as claimed in claim 1, wherein said sample is a magnetic recording head.

17. A method for optimizing the measurement of a magnetic field emitted by a sample, comprising the steps of:
   providing a sample that emits a magnetic field;
   propagating a charged particle beam through the magnetic field;
   detecting the impingement of the charged particle beam on the surface of the sample; and
   adjusting the propagation path of the charged particle beam relative to the sample on the basis of the detected impingement so that the charged particle beam is maximally deflected by the magnetic field without impinging on the sample surface.

18. A method for optimizing the measurement of a magnetic field emitted by a sample as claimed in claim 17, further comprising the steps of:
   measuring the deflection of the charged particle beam caused by the deflecting action of the magnetic field on the charged particle beam; and
   calculating the magnetic field intensity, based on the measured deflection, at a position through which the charged particle beam propagates through the magnetic field;
   wherein the propagation path of the charged particle beam is adjusted so as to maximize the calculated magnetic field intensity.

19. A method for optimizing the measurement of a magnetic field emitted by a sample as claimed in claim 18, wherein said impingement-detecting step includes providing an electric current, proportional to the measured deflection, that approaches zero as an indication of impingement.

20. A method for optimizing the measurement of a magnetic field emitted by a sample as claimed in claim 17, wherein the adjusting step includes the step of moving the sample relative to the charged particle beam propagation path to adjust the position of the path of the charged particle beam relative to the sample.

21. A method for optimizing the measurement of a magnetic field emitted by a sample as claimed in claim 17, wherein the adjusting step further comprises the step of changing the propagation path of the charged particle beam relative to the sample to adjust the position of the charged particle beam relative to the sample.

* * * * *